(12) United States Patent
Vashchenko et al.

(10) Patent No.: US 8,212,320 B1
(45) Date of Patent: Jul. 3, 2012

(54) HIGH VOLTAGE TOLERANT ESD DEVICE

(75) Inventors: Vladislav Vashchenko, Palo Alto, CA (US); Peter J. Hopper, San Jose, CA (US)

(73) Assignee: National Semiconductor Corporation, Dallas, TX (US)

( * ) Notice: Subject to any disclaimer, the term of this patent is extended or adjusted under 35 U.S.C. 154(b) by 379 days.

(21) Appl. No.: 11/375,831

(22) Filed: Mar. 15, 2006

(51) Int. Cl.
*H01L 23/62* (2006.01)

(52) U.S. Cl. ........ 257/359; 257/110; 257/162; 257/355; 257/E29.202

(58) Field of Classification Search .......... 257/359
See application file for complete search history.

(56) References Cited

U.S. PATENT DOCUMENTS

| | | | | |
|---|---|---|---|---|
| 5,324,971 | A * | 6/1994 | Notley | 257/328 |
| 6,365,932 | B1 * | 4/2002 | Kouno et al. | 257/341 |
| 6,521,952 | B1 * | 2/2003 | Ker et al. | 257/360 |
| 6,671,153 | B1 * | 12/2003 | Ker et al. | 361/111 |
| 6,750,515 | B2 * | 6/2004 | Ker et al. | 257/357 |
| 6,765,771 | B2 * | 7/2004 | Ker et al. | 361/56 |

* cited by examiner

*Primary Examiner* — Jerome Jackson, Jr.
(74) *Attorney, Agent, or Firm* — Wade J. Brady, III; W. James Brady; Frederick J. Telecky, Jr.

(57) ABSTRACT

In an ESD clamp formed in a SOI process, voltage tolerance is increased by introducing multiple blocking junctions between the anode and cathode of the device.

5 Claims, 2 Drawing Sheets

HIGH VOLTAGE TOLERANT ESD DEVICE

FIELD OF THE INVENTION

The invention relates to ESD devices. In particular it relates to ESD devices implemented using an SOI process.

BACKGROUND OF THE INVENTION

Numerous analog applications exist requiring high voltage tolerance, e.g., amplifier applications and flash memory to name but two.

In designing devices for use in high voltage applications, cross-talk between the devices is a common concern, one solution to dealing with this being the use of isolation regions between devices, as is realized in SOI processes.

Furthermore, whenever designing any additional protection feature it will be appreciated that it is highly desirable not to have to add additional process steps in order to achieve the structure but to be able to make use of existing process steps that are required in any event for forming other structures in the circuit. Such devices that require no additional process steps are commonly referred to as free devices.

The present invention seeks to provide a free ESD protection device with high voltage tolerance, implemented in a SOI process.

SUMMARY OF THE INVENTION

According to the invention, there is provided a high voltage tolerant ESD clamp that comprises a snapback device, e.g., in the form of a NPN Bipolar Junction Transistor (NPN BJT), Bipolar Silicon Controlled Rectifier (BSCR), DIAC or zener diode, comprising a drift region between an anode and a cathode, the device including a plurality of blocking junctions formed in the drift region.

In order to reduce cross-talk between the blocking junctions, the snapback device is implemented in a SOI process. Furthermore, in order to reduce punch-through effect the snapback device may include one or more buried layers, such as NBL or PBL, formed below the device.

The blocking junctions may comprise n-wells or NBLs formed in a p-well or PBL. A lower NBL may be formed below the p-well or PBL and the blocking junctions typically extend to the lower NBL to divide the p-well or PBL into separate p-well or PBL regions. The blocking junctions may be defined by the junctions between the p-well or PBL regions, and the n-wells or NBLs formed in the p-well or PBL.

Thus, according to the invention, the snapback devices define a higher voltage drop across their anode and cathode due to the cumulative effect of the voltage drops across each blocking junction. It will be understood that anode and cathode refer to the high voltage terminal and low voltage terminal, respectively, of the snapback device. Thus, for instance, in the case of an NPN transistor the anode is defined by the collector and the cathode by the emitter.

DETAILED DESCRIPTION OF THE INVENTION

Figure 1:
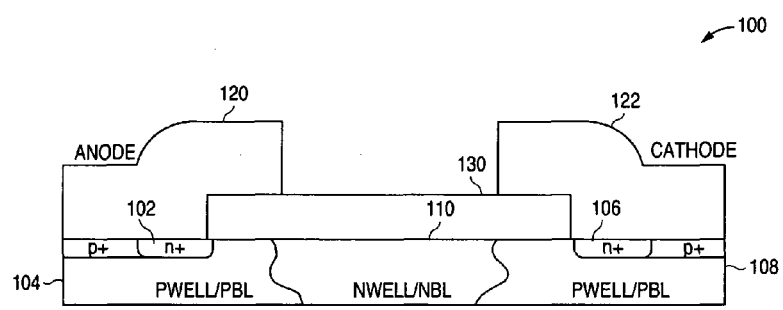
FIG. 1 shows a cross section through a prior art SOI DIAC.

FIG. 1 shows a typical DIAC as known in the art. The DIAC 100 includes first n-type region 102 formed in a first p-well or p-buried region (PBL) 104, and a second n-type region 106 formed in a second p-well or p-buried region (PBL) 108. An n-well or n-buried layer (NBL) 110 is formed between the first p-well or PBL 104 and the second p-well or PBL 108. As shown in FIG. 1, the DIAC includes anode polysilicon region 120 and cathode polysilicon region 122, which are isolated from the n-well/NBL 110 by an oxide layer 130.

Figure 2:
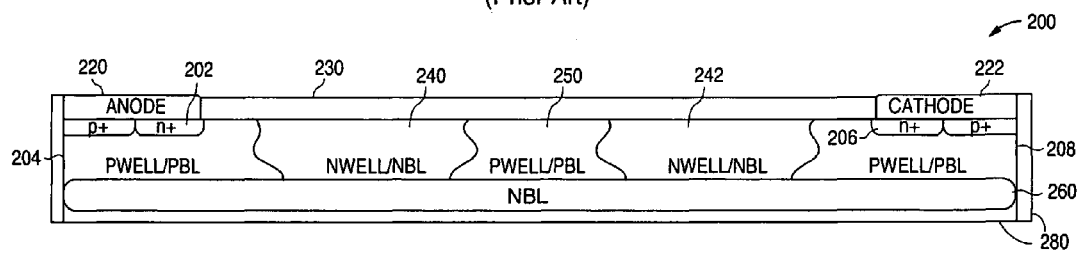
FIG. 2 shows a cross section through one embodiment of a SOI DIAC in accordance with the invention.

One embodiment, implemented, in a DIAC is shown in FIG. 2. Similar to the prior art device 100 of FIG. 1 the device 200 of FIG. 2 includes a first n+ region 202 with anode polysilicon region 220, the n+ region 202 being formed in first p-well or PBL 204. The device 200 further includes second n+ region 206 formed in second p-well or PBL 208 and having cathode polysilicon region 222. Again there is an oxide layer 230 formed between the anode poly 220 and cathode poly 222. However, in accordance with the invention, the device 200 now includes not only the single blocking junction as defined by a single n-well or n-buried layer, but includes a plurality of blocking junctions. These are defined in the present embodiment by a first n-well or n-buried layer 240, and a second n-well or n-buried layer 242 formed in a p-well or p-buried layer formed between the anode 220 and cathode 222. In order to reduce punch-through an isolation layer in the form of an n-buried layer (NBL) 260 is formed in one embodiment beneath the device 200. Furthermore, the devices are isolated by a silicon oxide isolation (SOI) region 280 forming a can around the device 200, or if an NBL is included, the SOI 280 is formed along the sides of the device and below the NBL 260, as shown in the FIG. 2 embodiment. The need for an NBL is dictated by the epi thickness. Since the p-well/PBL region between the anode 220 and cathode 222 (also referred to herein as the drift region) is separated by the n-well/NBL blocking regions 240, 242 and isolated by the NBL 260, it in effect defines three separated n-well/NBL blocking regions 204, 250, 208, with a first blocking junction between n-well/NBL 240 and p-well/PBL 250, and a second blocking junction between n-well/NBL 242 and p-well/PBL 208. Each of the two blocking junctions defines a voltage drop, the cumulative effect being a substantially higher voltage drop between anode and cathode than is the case in the prior art device 100 of FIG. 1.

Figure 3:
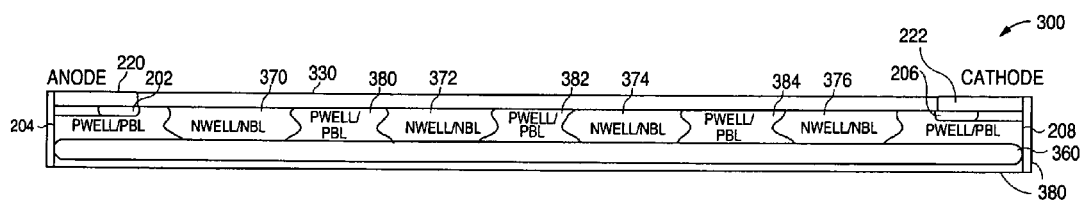
FIG. 3 shows a cross section through another embodiment of a SOI DIAC in accordance with the invention.

Another embodiment of the invention is shown in FIG. 3, which shows a DIAC with four blocking regions and four blocking junctions. Since many of the other regions and elements of the devices are similar to those of the FIG. 2 embodiment, same reference numerals have been used to depict similar items and are not described again here. As shown in the DIAC 300 of FIG. 3, the anode 220 is separated from the cathode 206 by an oxide layer 330 which is somewhat longer than the oxide layer 230 of the FIG. 2 embodiment, as is necessitated by the greater separation between anode and cathode in this embodiment in order to accommodate four n-well or NBL regions 370, 372, 374, 376. As shown, the n-well/NBL regions 370, 372, 374, 376 are formed in a p-well or PBL and isolated from each other by NBL 360, thus forming distinct p-well/PBL regions 204, 380, 382, 384, 208 between anode 220 and cathode 222. It will be appreciated that by adding four blocking regions to define four blocking junctions (one between n-well/NBL 370 and p-well/PBL 380, a second between n-well/NBL 372 and p-well/PBL 382, a third between n-well/NBL 374 and p-well/PBL 388, and a fourth between n-well/NBL 376 and p-well/PBL 208) the device 300 defines four voltage drops between anode and cathode to provide for a substantially higher cumulative voltage tolerance. Again, the device 300, like the device 200, is implemented in a SOI process to avoid cross talk between devices. Thus, the device 300 is surrounded by and oxide can 380 extending around the bottom and sides of the device.

While the above embodiments have been described with respect to a DIAC structure, the invention applies equally to other implementations, for example, using different numbers of multiple isolation regions between anode and cathode, and making use of other ESD clamp structures such as NPN Bipolar Junction Transistor (NPN BJT), Bipolar Silicon Controlled Rectifier (BSCR), or zener diode. In the case of devices making use of n+ regions as well as p+ regions, both a n-buried layer (NBL) as well as a p-buried layer (PBL) may be included below the device to avoid punch-through.

Figure 4:
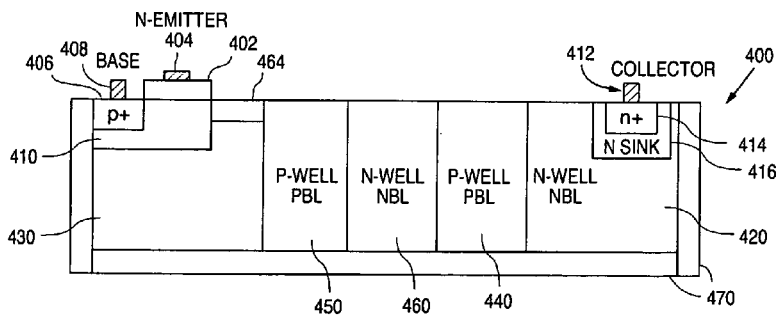
FIG. 4 shows a cross section through one embodiment of a SOI NPN BJT in accordance with the invention.

An embodiment involving an NPN BJT is shown in FIG. 4. The BJT 400 includes an emitter 402 with its contact 404; a base with its contact 408 defined by a p+ region 406 in a p-region 410; and a collector with collector contact 412. The collector is defined by an n+ region 414 in an n-sinker 416, which is in turn formed in an n-well/NBL 420. As shown in FIG. 4, the n-well/NBL 420 can be thought of as extending under the base since the p-region 410 is formed in an n-well/NBL 430. Two blocking junctions are introduced between the collector and the emitter by forming a p-well/PBL region 440 next to the n-well/NBL 420, and a p-well/PBL 450 next to the n-well/NBL 430, and an n-well/NBL 460 between the p-well/PBL regions 440, 450. As shown, the p-region 410 of the base is isolated from the p-well/PBL 450 by an oxide region 464. The device 400 is implemented in a SOI process and is therefore formed in an oxide can 470, as shown.

As mentioned above, the embodiments discussed herein are by way of example only and are not intended to limit the invention as claimed, to any particular embodiment.

What is claimed is:

1. A high voltage tolerant ESD clamp comprising,
an n+ region defining an anode, wherein the anode is formed in a p-region or n-region,
an n+ region defining a cathode that is laterally separated from the anode, wherein cathode is formed directly in a p-region or n-region,
a plurality of blocking regions in the form of multiple n-well regions or n-buried layer regions formed between the p-region in which the anode is formed and the p-region in which the cathode is formed, or in the form of multiple p-well regions or p-buried layer regions formed between the n-region in which the anode is formed and the n-region in which the cathode is formed, and
an oxide isolation region formed below the n-well regions or n-buried layer regions and the p-regions in which the anode and cathode are formed, or below the p-well regions or p-buried layer regions and the n-regions in which the anode and cathode are formed, wherein the blocking regions do not include any gates formed over blocking regions and the blocking regions do not include any n+ regions or p+ regions formed in the relatively lower doped blocking regions.

2. A clamp of claim 1, wherein the clamp defines a drift region between the anode and the cathode.

3. A clamp of claim 1, wherein a lower buried layer is formed below the p-regions and the n-well regions or n-buried layer regions, or below the n-regions and the p-well regions or p-buried layer regions, wherein the p-regions and the n-well regions or n-buried layer regions, or the n-regions and the p-well regions or p-buried layer regions, extend downward to the lower buried layer.

4. A clamp of claim 1, wherein the ESD clamp comprises an N-type Metal Oxide Semiconductor (NMOS) transistor, NPN Bipolar Junction Transistor (NPN BJT), Bipolar Silicon Controlled Rectifier (BSCR), DIAC or zener diode.

5. A clamp of claim 3, wherein the ESD clamp comprises an N-type Metal Oxide Semiconductor (NMOS) transistor, NPN Bipolar Junction Transistor (NPN BJT), Bipolar Silicon Controlled Rectifier (BSCR), DIAC or zener diode.

\* \* \* \* \*